United States Patent
Canning et al.

[19]

[11] Patent Number: 5,903,056
[45] Date of Patent: May 11, 1999

[54] CONDUCTIVE POLYMER FILM BONDING TECHNIQUE

[75] Inventors: Everett Joseph Canning, Trenton; Ranjan Dutta, East Windsor, both of N.J.

[73] Assignee: Lucent Technologies Inc., Murray Hill, N.J.

[21] Appl. No.: 08/845,111

[22] Filed: Apr. 21, 1997

[51] Int. Cl.⁶ .................................................. H01L 23/48
[52] U.S. Cl. ........................... 257/773; 257/746; 257/778
[58] Field of Search ..................................... 257/773, 778, 257/777, 785, 795, 798, 746

[56] References Cited

U.S. PATENT DOCUMENTS 5,001,542  3/1991  Tsukagoshi et al. ................... 257/746
5,136,365  8/1992  Pennisi et al. ......................... 257/783

*Primary Examiner*—Donald L. Monin, Jr.
*Assistant Examiner*—Nathan K Kelley

[57] ABSTRACT

The specification describes a thermocompression bonding process using anisotropic conductive film (ACF) bonding material in which the bonding pads are shaped to prevent depletion of conductive particles in the bonding region during compression. The process is useful in bump technology for interconnecting component assemblies on substrates such as glass, printed wiring boards, etc. The shaped structure can be made using photodefinable polymer strips around the bonding pads where the strips are thicker than the bonding pad. Alternative approaches to shaping one or both of the mating conductive surfaces are disclosed.

1 Claim, 2 Drawing Sheets

CONDUCTIVE POLYMER FILM BONDING TECHNIQUE

FIELD OF THE INVENTION

This invention relates to interconnection of electrical and optical components on support substrates. More specifically it relates to an improved conductive polymer film bonding technique for flat panel displays (FPD), multichip modules (MCM), printed wiring board (PWB) interconnections, and the like.

BACKGROUND OF THE INVENTION

Mounting and electrically connecting electrical and optical integrated circuit packages, and optical components such as lasers and LEDs has spawned a variety of interconnection technologies aimed at increasing the interconnect density, increasing reliability, and decreasing assembly costs.

Bump technology has developed along two paths, one for gold bumps used in displays, and one for solder bumps or solder balls used typically in solder assemblies, such as PWBs and MCMs. In current bump technology both gold bumps and solder bumps/balls are formed typically by plating. In some processes evaporation techniques have been used for forming solder bumps, since solder evaporates at a conveniently low temperature. In addition to gold and solder, other metals such as aluminum, nickel, copper, titanium, cobalt, tantalum, the platinum group metals, and alloys thereof are all candidates for current bump technology.

Solder bump/balls are typically 2–6 mils in height. The typical attachment technology is Surface Mount Technology (SMT). The SMT process is usually performed by stencil printing a eutectic solder paste on the PWB bond pads, placing the chip on the PWB with solder bumps/balls aligned to the solder paste coated bonding pads, and completing the attachment by solder reflow.

Gold bump chips are typically of the order of 20 microns high, and are used in TAB packages, and in chip-on-glass (COG) technology. Early COG techniques resembled the conventional lead-frame technique where the chip substrate was bonded face tip to the glass support and the bonding pads on the chip were connected to the circuit pattern on the glass using wire bonds. Current COG techniques follow a flip chip approach (FCOG) with the bonding pads on the chip aligned with bonding sites on the glass. These interconnection processes typically use gold bumps on the chip, and adhesives, typically Anisotropic Conductive Films (ACF) to adhere the gold bumps to the bonding sites on the glass. Anisotropic conductive films have proven reliable and cost effective. Details on ACF materials and their use is given by Hisashi Ando et al, Anisotropic Conductive Film, available from Sony Chemical Corporation.

A currently used FCOG process using ACF material involves gold bumps that have very flat bump tops. Typically the bumps are formed by plating the chip surface and lithographically defining the bump sites. The assembly sequence is as follows. The ACF is tacked to the chip bonding site on the glass substrate. The chip is picked up by the automated assembly equipment, aligned to the bond site, and heated to the appropriate bonding temperature. The chip is then placed, pushed through the ACF, and held in place with an appropriate bonding force applied until the adhesive reaches the desired state of cure. During the bonding process the conducting particles within the ACF are trapped in the gap region between the gold bump and the bond pad, and compressed to deform the particles. Particles e.g. 7–8 microns in diameter are typically compressed to 3–5 microns in height. The particles form a monolayer between the chip bumps and the bonding sites so that a large number of conductive paths are formed in the z-direction, while remaining spaced and therefore insulated from one another in the x-y directions.

While ACF materials in general have proven very effective in this technology, the conductive particles that are suspended in the polymer matrix tend to migrate away from the region between the mating contact surfaces due to the force exerted by the bonding pressure. When the density of conductive particles in the gap between the conductive members is too low the contact has excessively high resistance, and in some cases will result in a contact failure.

STATEMENT OF THE INVENTION

We have developed a thermocompression bonding process using ACF materials in which the bonding surfaces are shaped to retain the conductive particles of the ACF material in the gap between the conductive surfaces being bonded as the thermocompression step proceeds. In one embodiment of the invention a raised border, or "dam bar", is formed around the bonding pad using a photodefinable polymer film. Other techniques for shaping the bonding sites use e.g. lithographic shaping of the bonding pad itself, and/or shaping the bump.

DETAILED DESCRIPTION

Figure 1:
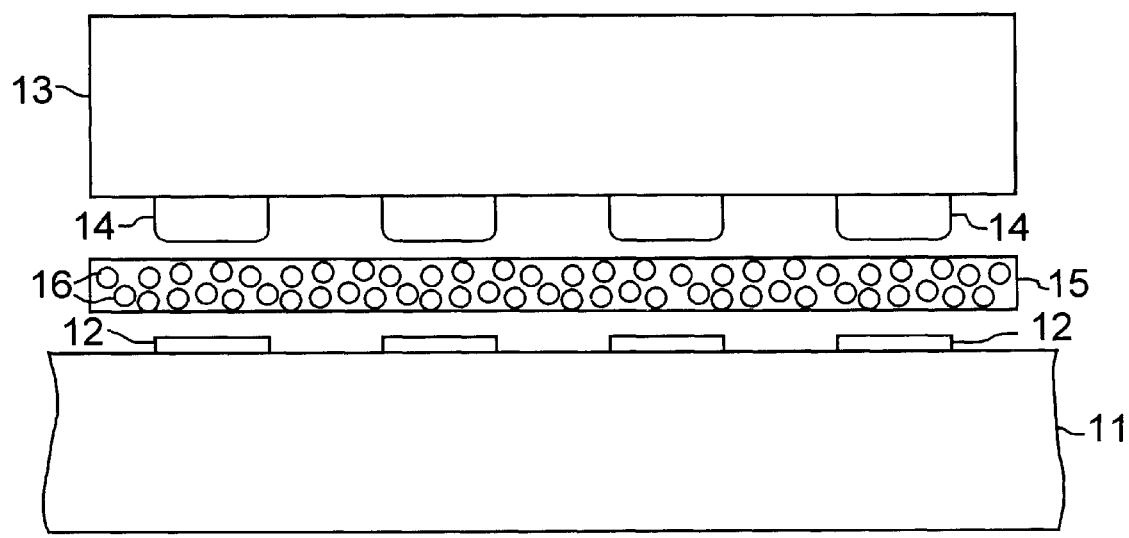
FIGS. 1 and 2 are schematic representations of a standard bump array bonding operation using an ACF material and showing the adverse effect of conductive particle depletion in the conductor region.

Referring to FIG. 1, a portion of a substrate is shown at 11 with an array of contact pads 12 formed e.g. by standard printed circuit techniques. The device chip or assembly 13 carries an array of bumps 14 which may be gold bumps or solder bumps as are standard in the art. The ACF film is shown at 15 with conductive particles at 16. In a typical interconnection process, e.g. flip chip on glass (FCOG), the glass substrate is of the order of 1–3 mm thick and the bonding areas 12 are portions of a metallization pattern, e.g. indium tin oxide, or aluminum. The pitch of these pads in current technology is of the order of 50–200 $\mu$m and the spacing between pads may be 20–50 $\mu$m. The bumps 14 in this illustration are gold bumps with dimensions corresponding to the contact pad array of the substrate in the x-y plane, and with a height (z-dimension) of typically 15–30 $\mu$m. The device package is square or rectangular with sides measuring typically in the 2–50 mm range.

Standard ACF materials are typically epoxies, and the conductive particles are typically gold-plated epoxy resin particles. The films are generally 10–40 $\mu$m thick and the conductive particles have an average diameter of 3–10 $\mu$m.

The bonding operation is conventional and involves the application of heat to the surfaces being bonded, while pressing the surfaces together. As suggested earlier the ACF bonding temperatures are typically above 200 degrees C. She pressure depends upon the ACF material and usually is above 0.5 tons per square inch of bump area, typically about 5 tons per square inch of bump area.

Figure 2:
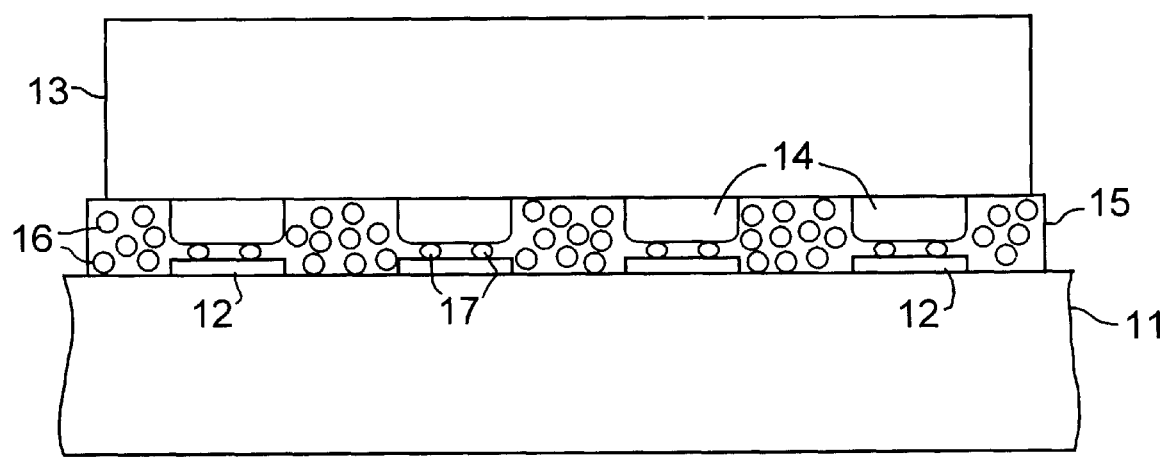

As seen in FIG. 2, after the bonding process has occurred, with the component assembly 13 and the substrate 11 thermocompressively bonded, the desired layer of conductive particles is depleted between the bumps 14 and pads 12 due to the migration of conductive particles out of the gap region due to the applied bonding force. Under typical thermocompression conditions the polymer matrix which contains the conductive particles softens significantly, enough that fluid dynamics allows rapid migration of the conductive particles in the polymer but not enough that the pressure in the polymer is completely hydrostatic. Under these conditions a pressure difference develops between the gap region between the conductor surface and the regions between the bumps and pads. Accordingly there is a flow of conductive particles away from the gap region leaving a depleted region in the gap where the particles are desired. The bond is formed as shown with relatively few conductive particles, giving a relatively high resistance bond.

Figure 3:
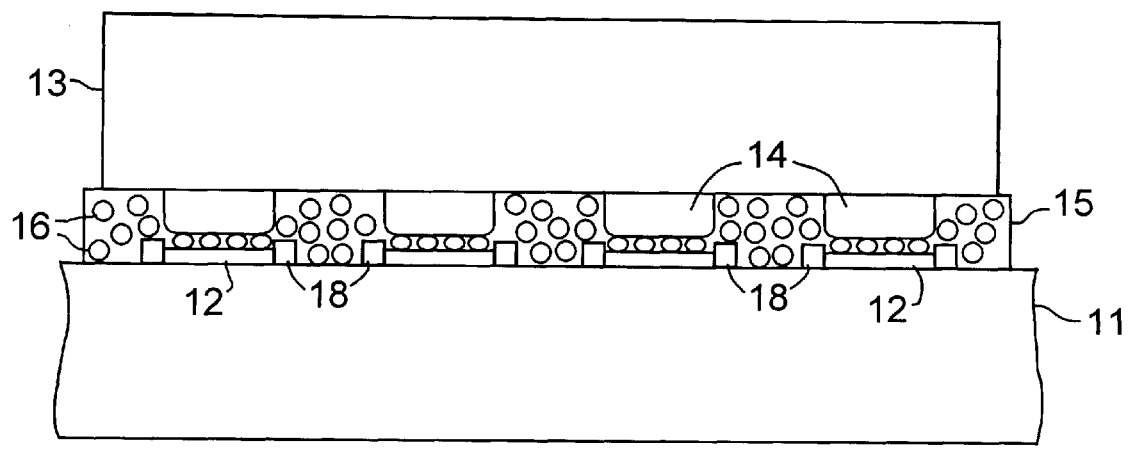
FIG. 3 is a schematic representation similar to that of FIGS. 1 and 2 showing the improved bonding operation with shaped conductor surfaces according to the invention.

In FIG. 3 the bonding pad regions 12 are provided with a raised border or dam bar 18 to trap the conductive particles in the gap region as the thermocompression force is applied. As illustrated more conductive particles in the ACF material are trapped in the gap and are compressed against the conductor surfaces of bumps 14 and pads 12 to ensure a proper conductive particle bridge between the substrates 11 and the component package 13. The conductive particles, typically of the order of 7 microns in their original shape (FIG. 1) are compressed to about 3 microns. The term dam bar is intended to define a category of raised strictures around the periphery of a flat conductor surface as shown at 18, and as described in other embodiments below.

The dam bar elements 18 in FIG. 3 are preferably formed using a photodefinable polymer. A suitable photodefinable polymer is described and claimed in U.S. Pat. No. 5,326,671, which is incorporated herein by reference. The polymer is a photodefinable triazine-based mixture including a photosensitive acrylate moiety. It comprises from twenty to sixty percent by weight of triazine and from one to ten percent by weight of siloxane-caprolactone copolymer. It may also include up to twenty percent by weight of novolak epoxy acrylate to improve the photodefinable properties. Additionally the mixture may optionally comprise one or more of the following: two to eight percent by weight of bis-phenol-A diglycidyl ether monoepoxyacrylate, zero to twenty percent by weight of carboxyl-terminated butadiene nitrile rubber, two to six percent of N-vinylpyyrolidone, one to ten percent of trimethylolpropanetriacrylate, zero to five percent glycidoxypropyltrimethoxysilane, 0.05 to five weight percent photoinitiator, zero to two percent pigment, 0.1 to one percent surfactant, zero to 0.3 percent copper benzoylacetonate, and thirty to fifty percent solvent.

In our process the triazine composition just defined is spray coated on substrate 11 to the desired thickness then baked at 50 degrees C. for two hours. The thickness depends on the thickness of the conductive bonding pad, and must be at least as thick as the pad plus at least 25% of the diameter of the conductive particles in the ACF material. The thickness is measured from the surface of the substrate on which the bonding pad is formed. If the average diameter of the conductive particles is of the order of 5–10 microns, and the final gap width is of the order of 2–7 microns, the raised border 18 should have a raised portion of at least a micron and preferably two microns, i.e. the thickness of the photodefinable polymer after cure should equal the thickness of pad 12, plus one micron.

The spray coated substrate is then masked, with the pattern geometry to produce the pad borders 18, and exposed to actinic radiation i.e. UV radiation at 365 nm with a power of twenty to forty milliwatts per square centimeter. Exposure to the actinic light crosslinks and cures the polymer making it insoluble in the developer solution. The layer is developed by spraying on a suitable developer, e.g. butyl butyrate, thereby removing the unexposed regions and leaving the dam bars 18. The material of these dam bars has an average $T_g$ of less than 200 degrees C., typically approximately 180 degrees C.

This photodefinable dielectric material comprises from twenty to sixty weight percent of triazine and from one to ten weight percent of siloxane-caprolactone copolymer, and has a glass transition temperature $T_g$ of approximately 180° C. Since a typical bonding process requires temperatures of the order of 220° C.–240° C., it might be expected that this material would not perform adequately as a polymer bump material. However, it has proven highly successful in practice. While we experienced success with the specific polymer material described, other suitable materials may be used as well.

Figure 4:
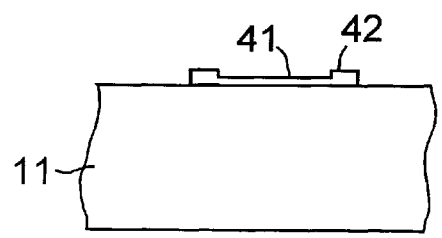
FIGS. 4–6 are schematic representations of alternative conductor surface modifications according to the invention.
Figure 5:
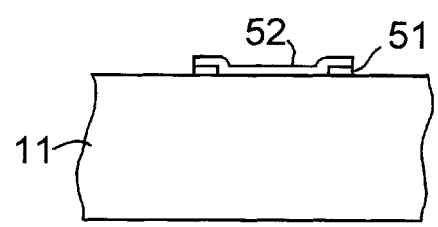
Figure 6:
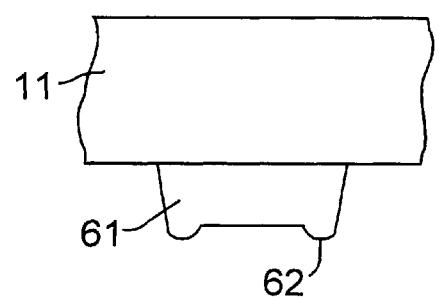

Other approaches to shaping the mating surfaces between thermocompression bonds with ACF materials will occur to those skilled in the art. Three examples of possible pad and bump designs are shown in FIGS. 4–6. FIG. 4 shows substrate 11 and a bonding pad 41 with an integrated peripheral dam bar 42. In this embodiment the integrated structure is metal, and may be formed by standard photolithographic and or liftoff techniques. In FIG. 5, the peripheral ridge or dam bar is formed by constructing a border structure 51 prior to the application of the bonding pad, then depositing the bonding pad material 52 over the contact region and over the border structure as shown in the Figure. The height of the dam bar is determined by the thickness of the border structure 51. The material of the structure 51 can be either metal or polymer.

If the bond pad design of either FIG. 4 or 5 is used, the width of the bonding pad and the peripheral particle retaining dam bar can be the same as the width of the mating conductive bump since the surface of the dam bar in these embodiments is conductive. With this option it is preferred that the bumps be compliant, i.e. compressible, or if the border structure 51 is compliant. The photodefinable polymer material described above meets this criteria, as would other compliant polymer materials known in the art. A preferred bump structure for this invention is a metal coated photodefinable polymer such as the structure described in co-pending application Ser. No. 08/826,606 filed Apr. 3, 1997 now U.S. Pat. No. 5,783,465 (E. J. Canning et al Case 8-3-1-1) filed Apr. 3, 1997. The compliant metal coated photodefinable polymer material described in this application can also be used advantageously to form the bonding pad structure with the dam bar integrated as in FIG. 4.

An alternative approach to containing conductive particles in the bond region involves shaping the surface of the conductive bump. An example is shown in FIG. 6, where substrate 11 has formed thereon a solder or gold bump 61 having a raised portion or dam bar 62 around the periphery of the bump surface. It will be appreciated by those skilled in the art that the dam bar 62 functions in a manner similar to the dam bars 18, 42 and 51 of FIGS. 3, 4, and 5 respectively. A preferred bump structure is the one disclosed above, with the photodefinable polymer shaped by techniques known in the art to provide the raised peripheral features 62.

Yet another option is to shape both mating surfaces. However, if the shaped ridge on both surfaces are designed to mate the combined ridge height on both surfaces should not exceed the diameter of the conductive particles in the ACF material. Alternative arrangements where the dam bars on the mating surface do not themselves mate, i.e. one fits inside within the other when the surfaces are urged together, will occur to those skilled in the art.

The interconnect technique of the invention can be used to advantage in a wide variety of applications. Most of these will involve electronic or photonic integrated circuits and electrooptic devices. For the purpose of definition the term electronic package is intended to cover generically all such integrated circuit devices, electrooptic devices, and related electrical products. Typically the substrate in these packages is provided with bonding pads and the components are provided with conductive bumps or balls. However, packages can be designed with these features reversed, or with bonding pads on both elements being assembled.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. An electronic package comprising an electrical component interconnected to a substrate, said substrate having an essentially planar surface, and a plurality of conductive bonding pads on said surface, said plurality of bonding pads having an essentially flat surface with a thickness $t_1$, an anisotropic conductive film (ACF) material bonded between a conductive surface on said electrical component and said plurality of bonding pads, said ACF material containing conductive particles, wherein the improvement comprises a plurality of individual electrically conductive dam bars on said surface surrounding each of said plurality of conductive bonding pads for retaining said conductive particles in said thermocompression bond, said dam bars having a thickness $t_2$, where $t_2$ exceeds $t_1$ by at least 25% of the average diameter of said conductive particles.

* * * * *